(12) United States Patent
Jhung et al.

(10) Patent No.: US 8,073,020 B2
(45) Date of Patent: Dec. 6, 2011

(54) WAVELENGTH TUNING APPARATUS AND METHOD THEREOF

(75) Inventors: Jhinsup Jhung, Seoul (KR); Byoungmin Kim, Gyeonggi-do (KR)

(73) Assignee: Openbase Co., Ltd., Seoul (KR)

( * ) Notice: Subject to any disclaimer, the term of this patent is extended or adjusted under 35 U.S.C. 154(b) by 549 days.

(21) Appl. No.: 12/172,612

(22) Filed: Jul. 14, 2008

(65) Prior Publication Data

US 2009/0185586 A1 Jul. 23, 2009

(30) Foreign Application Priority Data

Jan. 18, 2008 (KR) .................. 10-2008-0005828

(51) Int. Cl.
*H01S 3/10* (2006.01)
(52) U.S. Cl. ........................................................ 372/20
(58) Field of Classification Search ............... 372/20, 372/102; 356/328, 334, 305
See application file for complete search history.

(56) References Cited

U.S. PATENT DOCUMENTS

| | | | |
|---|---|---|---|
| 3,600,093 A * | 8/1971 | McMahon | 356/334 |
| 2003/0081638 A1* | 5/2003 | Hamster et al. | 372/23 |
| 2007/0160325 A1* | 7/2007 | Son et al. | 385/37 |
| 2009/0207871 A1* | 8/2009 | Koshimae et al. | 372/38.07 |

* cited by examiner

*Primary Examiner* — Alessandro Amari
(74) *Attorney, Agent, or Firm* — Rabin & Berdo, P.C.

(57) ABSTRACT

A wavelength tuning apparatus and method that maintain highest efficiency with a single angle manipulation without changing a position of input/output light. For this, the wavelength tuning apparatus and method include a transmission-type diffraction grating and a mirror that are constructed in one-body type so that a light path that enables an optimal efficiency diffraction angle of the diffraction grating can be formed, and rotates the one-body construction to obtain a desired wavelength. Accordingly, efficiency and precision of manipulation and control can be increased, and costs can be reduced.

16 Claims, 16 Drawing Sheets

(a)                    (b)

WAVELENGTH TUNING APPARATUS AND METHOD THEREOF

BACKGROUND OF THE INVENTION

1. Technical Field

The present invention relates to a wavelength tuning apparatus and method, and more particularly, to a wavelength tuning apparatus and method which can maintain highest efficiency with a single angle manipulation without changing a position of input/output light.

2. Background Art

The development of optics influences various industry fields and a wide range of next generation technologies from micromachining to high-speed communications are based on the optics. Particularly, optics applied to industrial and medical technologies such as a technique for reforming or micromachining a surface using a laser light having high straightness, a technique for separating a particular cell or a medical mass, a technique for reproducing data using optical media, high speed communications using total reflection of optical fibers, a microscope technology for recognizing a construction of a nano-size three-dimensional sample, and the like has become more important.

General laser optics mostly uses a single wavelength. However, as the demand for applications using various wavelengths increases, wavelength tuning laser optical devices that can tune wavelengths have been introduced to significantly increase a band of communications, analyze various samples, or select such a wavelength to provide optimal characteristics from among a wide range of wavelengths.

A wavelength tuning laser applying a technique for tuning a wavelength of a laser beam has a different construction according to purposes. However, a wavelength tuning laser generally applicable to various optical applications selects and outputs a desired wavelength by controlling a diffraction angle of a laser light source having a predetermined wavelength band.

FIG. 1 is a view illustrating a construction of a wavelength tuning apparatus applying a Littrow cavity that is well known. Here, the cavity represents a construction used for optical resonance including a diffraction grating, a mirror, a lens, etc., and is generally called an optical cavity.

As shown in FIG. 1, a laser light generated through a laser diode 1 becomes a parallel light through a collimator lens 2 and is incident on a reflective diffraction grating 3. The incident light is diffracted at a specific angle according to a construction of the reflective diffraction gratings 3 to be reflected from the mirror 4.

In this construction, a wavelength can be selected by controlling an angle of the diffraction grating 3, and a light path is changed according to the selected wavelength. Therefore, in order to fix the light path, complex operations such as controlling a position of the incident light or the mirror 4 are needed. In addition, an effective profile according to the diffraction angle of the incident light is different according to wavelengths, so that maintaining highest efficiency at all wavelengths is difficult. In addition, a reflective diffraction grating has absolutely low diffraction efficiency. Accordingly, diffraction efficiency of this construction is absolutely low since the reflective diffraction grating 3 is used in this construction. Therefore, when the wavelength tuning laser apparatus is implemented, a size of the apparatus is large, and maintaining the position and the path of the light is difficult. Therefore, there are problems in that high costs and a large size are needed and precision is low.

FIG. 2 is a view illustrating a construction of a wavelength tuning apparatus applying a Littman cavity. Referring to FIG. 2, a laser light generated through a laser diode 11 becomes a parallel light through a collimator lens 12 and is diffracted at a diffraction angle by a reflective diffraction grating 13. The diffracted light is reflected from a mirror 14 and incident on the reflective diffraction grating 13 again to be diffracted at a specific angle.

In this construction, a wavelength can be selected by controlling an angle of the mirror 14. Since a position of the diffraction grating 13 for reflection is fixed, there are advantages in that a position of the incident light and a path of an output light are not changed. However, this construction has a very low efficiency since not only it reflects a plurality of beams using the diffraction grating 13 which cannot reflect 100% of input light but also reflection efficiency that is changed according to wavelengths cannot be compensated. Accordingly, a range of wavelengths that can be selected is decreased. Specifically, a large number of laser diodes of which wavelength regions may overlap are needed to provide a wide range of wavelengths, so that costs are increased. In addition, a period for replacing a laser diode to select a wavelength is decreased, so that an operation time is increased. In addition, a light path is limited by the reflective diffraction grating 13 whose position is fixed, so that the selection of light path is limited. Therefore, in order to solve the limitation, additional mirror structures are needed, and a size thereof increases.

Therefore, there is a rapidly increasing need for a wavelength tuning apparatus and method in which a light path can be freely designed, the light path is not changed according to the selected wavelength, output efficiency and precision of wavelength selection are high, control needed for wavelength selection is simple, and a size thereof is small.

SUMMARY OF THE INVENTION

To overcome the above problems, the present invention provides a wavelength tuning apparatus and method which includes a transmission-type diffraction grating and a mirror which are constructed in one-body type so that a light path that enables an optimal efficiency diffraction angle of the diffraction grating can be formed, rotates the one-body construction to obtain a desired wavelength, and performs a simple manipulation to select a high efficiency wavelength.

The present invention also provides a wavelength tuning apparatus and method which can design a desired light path by selecting a diffraction grid arrangement angle of a transmission-type diffraction grating in a state where highest efficiency is maintained to increase the degree of design freedom of the wavelength tuning apparatus and reduce a size of the apparatus.

The present invention also provides a wavelength tuning apparatus and method which is automatically set so that efficiency for a wavelength selected from a wide wavelength band is the highest efficiency of the corresponding wavelength by performing a simple angle adjusting operation according to wavelengths.

The present invention also provides a wavelength tuning apparatus and method which combines a volume phase holographic grating (VPHG) and a mirror at a fixed angle so that a diffraction angle of transmitted light in consideration of an angle of incidence of light incident on the VPHG having high transmission efficiency for a wide wavelength band and an arrangement angle of diffraction grids is the highest efficiency angle and the light is converged into a pinhole, so as to reduce a size of the apparatus and increase efficiency and wavelength selection precision with a single operation unit.

The present invention also provides a wavelength tuning apparatus and method which maintains optimal efficiency according to the selected wavelength to enable effective outputs for most of wavelength bands provided from laser diodes and mechanically or electrically selects one from a plurality of the laser diodes having different wavelength bands, so as to select a precise wavelength from a wide band with the small number of the laser diodes.

According to an aspect of the present invention, there is provided a wavelength tuning apparatus including: a light source unit having a predetermined wavelength band; a transmission-type diffraction unit diffracting a light provided from the light source unit at an angle according to a grid arrangement angle; a mirror which is disposed to be adjacent to the transmission-type diffraction unit so that a light that passes at a highest efficiency diffraction angle obtained by using an angle of light incident on the transmission-type diffraction unit and the grid arrangement angle passes through a target light path; a combining unit combining the transmission-type diffraction unit with the mirror as a single structure; and a driving unit rotating the combining unit according to a selected wavelength.

In the above aspect of the present invention, the highest efficiency diffraction angle may be an angle of light which is symmetrical to the angle of incidence on the transmission-type diffraction unit, and the highest efficiency diffraction angle may be equal to the angle of incident light.

In addition, the light source unit may include a plurality of light sources having different wavelength bands and a light source selecting unit for mechanically selecting one from among the light sources.

In addition, the light source unit may be a laser pointer and further include a coupler which reflects a portion of the light reflected from the mirror to set an external cavity.

In addition, the wavelength tuning apparatus may further include: a lens for converging the light reflected from the mirror; and a pinhole lens through which only a wavelength of the light converged on the lens transmits.

In addition, the wavelength tuning apparatus may further include a partial reflection unit and a monitor unit for reflecting a portion of the light reflected from the mirror and converting a magnitude of the output into an electrical signal.

In addition, the driving unit may rotate the transmission-type diffraction unit and the mirror on a point at which a diffraction axis of the transmission-type diffraction unit and an extended line of a reflection surface of the mirror cross.

In addition, the wavelength tuning apparatus may include one or more of a shape correcting unit for correcting the light provided from the light source to have a circular shape and a focus correcting unit for correcting a focus.

In addition, the transmission-type diffraction unit may be a volume phase holographic grating (VPHG).

According to another aspect of the present invention, there is provided a wavelength tuning apparatus including: a light source unit having a predetermined wavelength band; a mirror reflecting a light provided from the light source unit; a transmission-type diffraction unit which transmits and diffracts light reflected from the mirror at an angle that changes according to a grid arrangement angle and is disposed to be adjacent to the mirror so that light having a diffraction angle that is equal to an angle of incident light with respect to the grid arrangement angle passes on a target light path; a combining unit fixing an arrangement angle between the mirror and the transmission-type diffraction unit to combine the mirror and the transmission-type diffraction unit as a single structure; and a driving unit rotating the combining unit according to a selected wavelength.

According to another aspect of the present invention, there is provided a wavelength tuning apparatus which includes a laser output construction having a laser light source unit and an external cavity, including: a transmission-type diffraction grating, which is a VPHG, transmitting and diffracting an incident laser light according to a grid arrangement angle; a mirror for determining a light path so as to enable light output at a diffraction angle which is symmetrical to an angle of incidence of light incident on the transmission-type hologram diffraction grating with respect to the grid arrangement angle to be converged on an output point; a combining unit for arranging and fixing the transmission-type hologram diffraction grating and the mirror to have a fixed angle; and an optical cavity which includes a driving unit for rotating the combining unit.

In the above aspect of the present invention, the transmission-type diffraction grating and the mirror may be arranged in reverse order of the light path.

In addition, only the wavelength selected according to an angle of the combining unit on the light path is converged on the output point and fed back to be resonated, and other wavelengths are diverged and destroyed.

In addition, the wavelength tuning apparatus may further include a control unit for controlling the driving unit by using a wavelength determined according to an external control signal and an angle according to the determined wavelength.

According to another aspect of the present invention, there is provided a wavelength tuning method including steps of: arranging a laser light source unit outputting a plurality of wavelengths according to a determined light path; arranging a transmission-type diffraction unit which transmits and diffracts light provided from the laser light source unit according to a grid arrangement angle, and arranging a mirror which determines a light path so as to enable light output at a diffraction angle which is symmetrical to an angle of incidence of light incident on the transmission-type hologram diffraction grating with respect to the grid arrangement angle to be converged on an output point; obtaining an angle of incidence of light incident on the transmission-type diffraction unit in consideration of a distance between the grids by selecting a desired wavelength; rotating the transmission-type diffraction unit and the mirror which are integrated as one so as to have the angle of incident; and resonating a selected wavelength from the plurality of wavelengths output from the laser light source and outputting the resonated wavelength to the output point.

In the above aspect of the present invention, the transmission-type diffraction unit may be a VPHG.

In addition, the step of rotating may be performed on a point at which a diffraction axis of the transmission-type diffraction unit and an extended line of a reflection surface of the mirror cross.

In addition, the step of obtaining the angle of incidence of light incident on the transmission-type diffraction unit is performed by using $\theta=\sin^{-1}(\lambda/2d)$, where $\theta$ is the angle of incidence of the diffraction unit, $\lambda$ is the desired selected wavelength, and d is the distance between the grids.

In addition, the step of arranging the laser light source unit may further include a step of arranging a plurality of laser light sources outputting different wavelength bands so that one is mechanically selected and replaced from the laser light sources and selecting and arranging a laser light source outputting a wavelength band including the corresponding wavelength.

In addition, the step of resonating further comprises a step of controlling current of the laser light source unit by measuring a magnitude of the output wavelength such that the output wavelength has a predetermined magnitude.

The wavelength tuning apparatus and method according to an exemplary embodiment of the present invention includes a transmission-type diffraction grating and a mirror which are constructed in one-body type so that a light path that enables an optimal efficiency diffraction angle of the diffraction grating can be formed, and rotates the one-body construction to obtain a desired wavelength. Accordingly, efficiency and precision of manipulation and control can be increased, and costs can be reduced.

The wavelength tuning apparatus and method according to an exemplary embodiment of the present invention can design a desired light path by selecting a diffraction grid arrangement angle of a transmission-type diffraction grating in a state where highest efficiency is maintained. Accordingly, the degree of design freedom of the wavelength tuning apparatus can be increased and a size of the apparatus can be reduced.

The wavelength tuning apparatus and method according to an exemplary embodiment of the present invention is automatically set so that efficiency for a wavelength selected from a wide wavelength band is the highest efficiency of the corresponding wavelength by performing a simple angle adjusting operation according to wavelengths. Accordingly, the highest efficiency of the selected wavelength can be maintained without any additional amendment or manipulation.

The wavelength tuning apparatus and method according to an exemplary embodiment of the present invention combines a volume phase holographic grating (VPHG) and a mirror at a fixed angle so that a diffraction angle of transmitted light in consideration of an angle of incidence of light incident on the VPHG having high transmission efficiency for a wide wavelength band and an arrangement angle of diffraction grids is the highest efficiency angle and the light is converged into a pinhole. Accordingly, not only the size of the apparatus and cost can be reduced but also efficiency and wavelength selection precision can be increased by reducing the size and number of the operation unit.

The wavelength tuning apparatus and method according to an exemplary embodiment of the present invention maintains optimal efficiency according to the selected wavelength to enable effective outputs for most of wavelength bands provided from laser diodes and mechanically or electrically selects one from a plurality of the laser diodes having different wavelength bands, so as not only to increase the numbers of wavelengths to be selected without changing light source but also to select a precise wavelength from a wide band with the small number of the laser diodes. Accordingly, the size of the apparatus and cost can be reduced.

DETAILED DESCRIPTION OF INVENTION

Exemplary embodiments of the present invention will now be described in detail with reference to the accompanying drawings.

Figure 1:
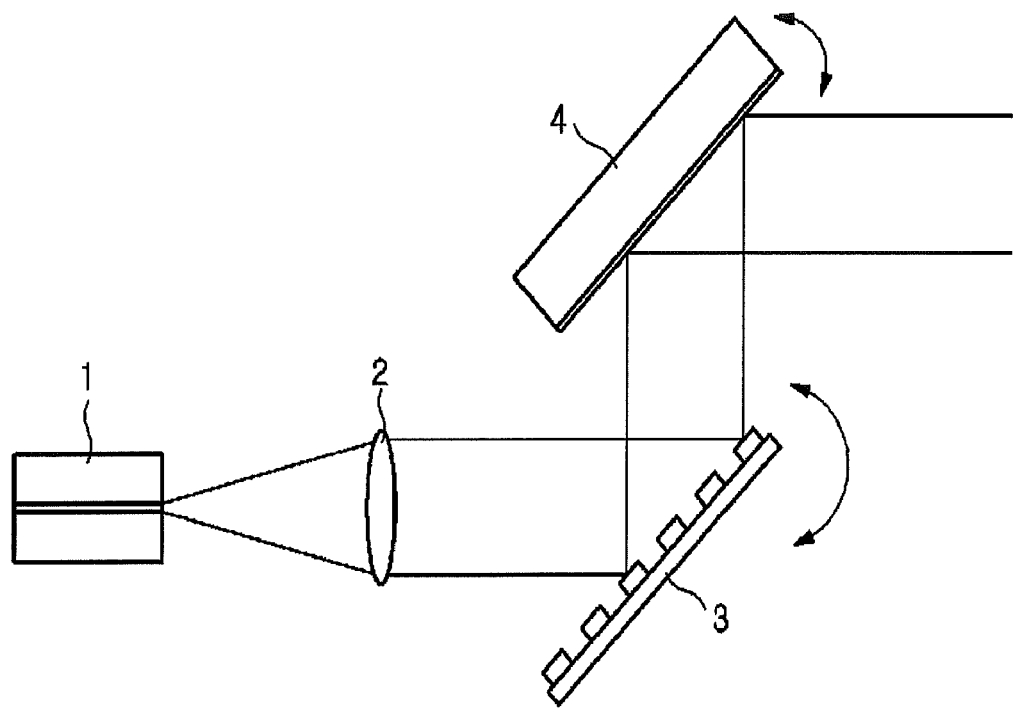
FIG. 1 is a conceptual view illustrating a construction of a conventional Littrow cavity.
Figure 2:
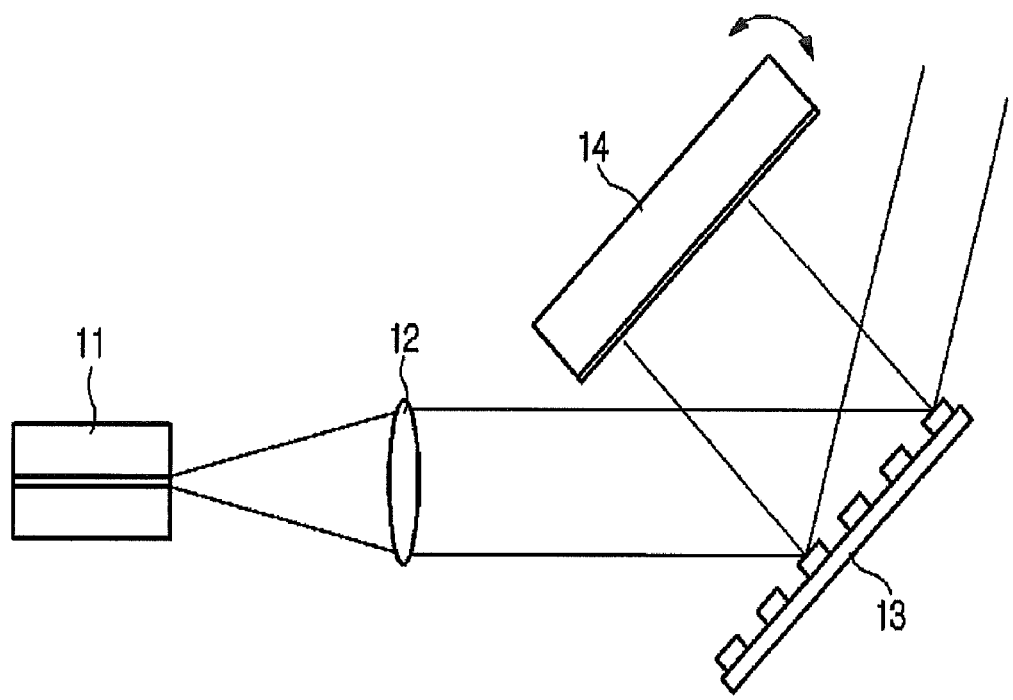
FIG. 2 is a conceptual view illustrating a construction of a conventional Littman cavity.
Figure 3:
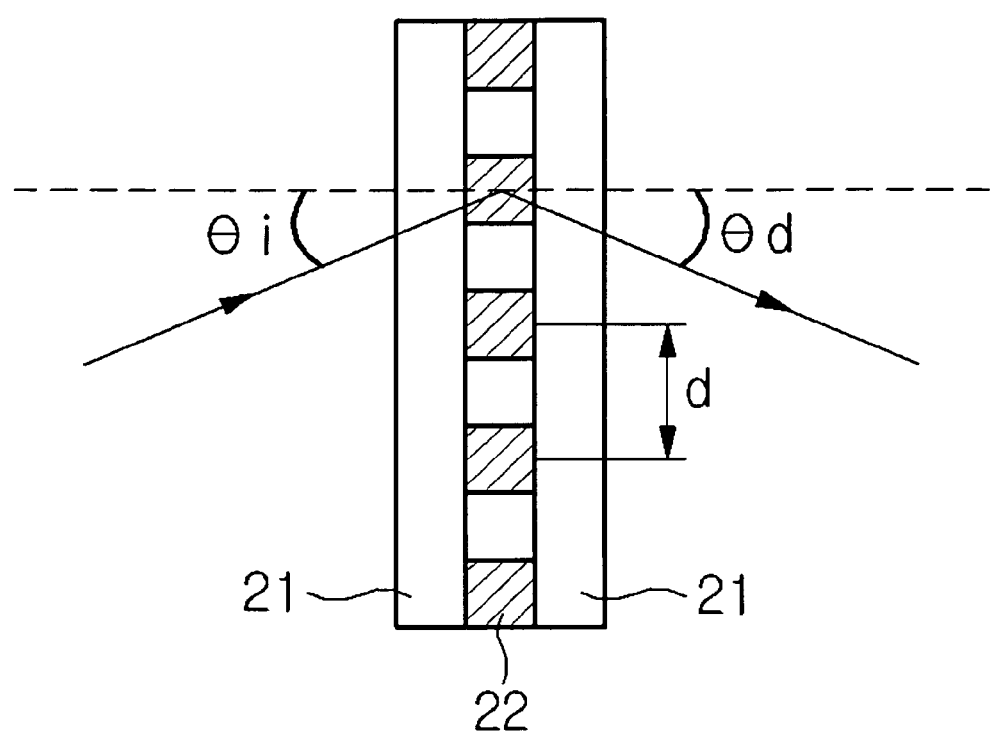
FIG. 3 is a view illustrating a construction of a transmission-type diffraction grating for explaining the characteristics of the transmission-type diffraction grating.

FIG. 3 illustrates a construction of a transmission-type diffraction grating. The illustrated diffraction grating is a volume phase holographic grating (VPHG) which has high transmittance for most of an applicable wavelength band in optics.

The illustrated diffraction grating includes front and rear transparent transmission plates 21 interposing grids 22 which diffract a propagating direction of a wavelength.

The diffraction grating diffracts incident light to distortedly transmit the light to a predetermined range. In this case, efficiency of light that is output at an angle of reflection which is equal to an angle of incidence is highest. Specifically, among transmitting lights, light which is output at a diffraction angle $\theta_d$ of that is symmetrical to an angle of incidence $\theta_i$ with respect to a virtual perpendicular line (dotted line) which is perpendicular to the diffraction grating, has highest efficiency. The angle of incidence with optimal efficiency and the angle of the transmitting light corresponding to the angle of incidence are changed according to a desired wavelength and a distance d between grids. Therefore, in order to obtain light which transmits and is diffracted with optimal efficiency, an optimal angle of incidence according to a wavelength λ and an angle of transmitting light according to the optimal angle of incident are needed. This can be obtained by Equation 1.

$$\lambda = d(\sin\theta_i + \sin\theta_d) \qquad \text{[Equation 1]}$$

Specifically, an optimal angle $\theta_i$ of incidence for a desired wavelength and a diffraction angle $\theta_d$ of transmitting light can be obtained by using $\sin^{-1}(\lambda/2d)$. Here, the angle of incidence and the diffraction angle of the transmitting light are equal. A reference line for obtaining the angle of incidence and the diffraction angle is determined on the basis of an arrangement angle of the grids 22. The gird arrangement angle is perpendicular to the diffraction grating, so that the perpendicular line is used as the reference line. A case where the grid arrangement angle is changed will be described with reference to FIG. 9.

Figure 4:
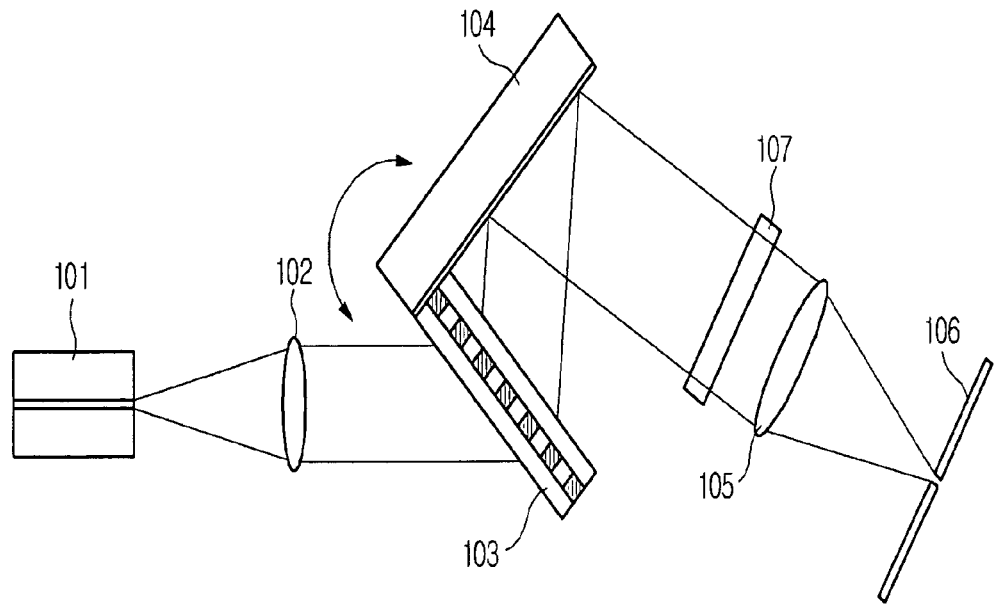
FIG. 4 is a view illustrating an example of a construction of a wavelength tuning apparatus according to an embodiment of the present invention.

FIG. 4 illustrates an example of a construction of a wavelength tuning apparatus including an optical cavity according to an embodiment of the present invention. Here, a laser generation apparatus which is widely applied is illustrated. However, it will be understood by those skilled in the art that the present invention may be used in applications using various light sources, a spectrometer or a single-wavelength detector.

The apparatus includes a laser diode 101 that can output a laser with a plurality of wavelengths, a collimator lens 102 which allows the output light from the laser diode 101 to be parallel, a transmission-type diffraction grating 103 through which the parallelized light is diffracted and transmitted, a mirror 104 which reflects the diffracted light for setting a light path, and a lens 105 which converges the light reflected by the mirror 104 to enable the converged light to pass through a pinhole of a pinhole lens 106. Here, in order to select and resonate a desired wavelength, a coupler 107 for reflecting a portion of the incident light may further be included.

The transmission-type diffraction grating 103 may preferably be the VPHG having high transmittance, and the mirror 104 may preferably be a silver mirror or a dielectric mirror. In addition, while side portions of the transmission-type diffraction grating 103 and the mirror 104 may touch each other as illustrated in FIG. 4, the transmission-type diffraction grating 103 and the mirror 104 may be constructed differently as long as they have a fixed angle with each other on a light path.

The transmission-type diffraction grating 103 and the mirror 104 are combined with each other at a fixed angle to be considered as a single rotation component. Specifically, when the transmission-type diffraction grating 103 is rotated to select a specific wavelength from the incident light, the mirror 104 is operated to align a light path of the selected wavelength output at a diffraction angle that is equal to an angle of incidence of the incident light to be aligned with the pinhole of the pinhole lens 106. In this construction, the light having the selected wavelength of the incident light is diffracted by the transmission-type diffraction grating 103 at the diffraction angle with highest efficiency, and the diffracted light is incident on the pinhole lens 106 by the mirror 104. The desired wavelength can be selected by controlling the angle of incidence of the incident light. Since the mirror 104 is combined with the transmission-type diffraction grating 103 at the fixed angle and rotated, light having any selected wavelength can be diffracted at a highest efficiency diffraction angle and output through the pinhole.

Figure 5:
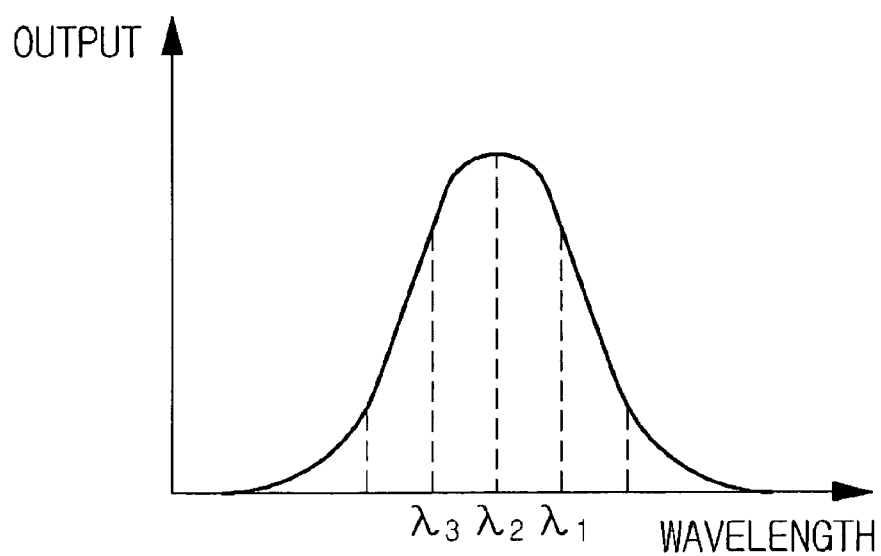
FIG. 5 is a graph illustrating spectrums and gain profiles of a laser diode.

In general, a laser has a spectrum profile (dotted lines) and a gain profile (full line) as illustrated in FIG. 5. For example, a laser having a wavelength band ranging from 630 to 638 nm has a largest gain at a wavelength of 635 nm near the center wavelength and has gains that are larger than a certain level at other wavelengths.

A simple laser pointer without an external cavity produces light at the wavelength of 635 nm near the center wavelength. However, in a case where the external cavity is provided to partially reflect a predetermined selected wavelength to induce resonance, light can be produced at adjacent wavelengths having gains of predetermined magnitudes or more.

Therefore, if the external cavity is provided to select a predetermined wavelength so that the predetermined wavelength is emitted to an output point to be partially reflected, a wavelength tuning apparatus capable of outputting a laser having a selected wavelength can be implemented.

According to the embodiment, as a core component of the optical cavity of the external cavity, the one-body structure including the transmission-type diffraction grating 103 and the mirror 104 is applied, and the one-body structure is rotated to select a wavelength to determine an angle of incident light. As described above, the angle between the diffraction grating 103 and the mirror 104 is determined so that the angle of the incident light and an angle of the diffracted light are equal and light reflected by the mirror can be condensed into the output point. Therefore, highest efficiency can be maintained.

Figure 6:
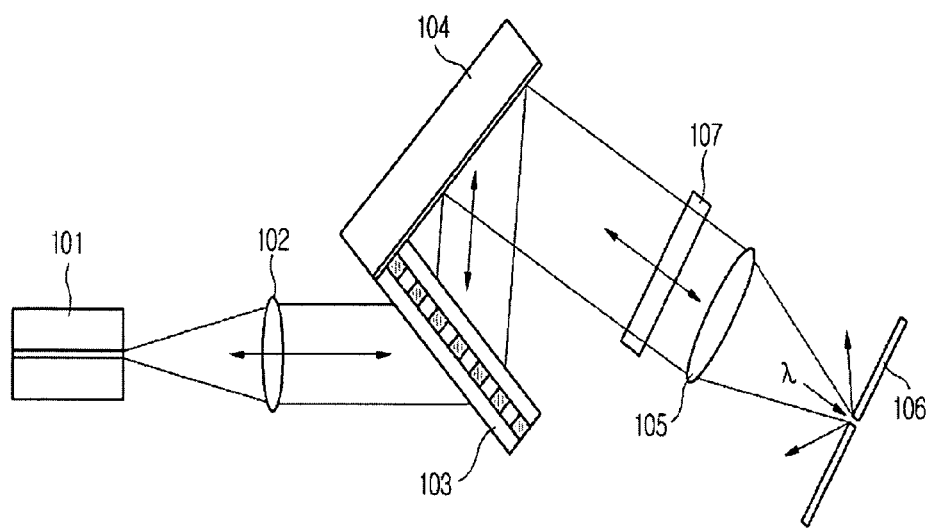
FIG. 6 is a view illustrating operations of a wavelength tuning apparatus according to another embodiment of the present invention.
Figure 7:
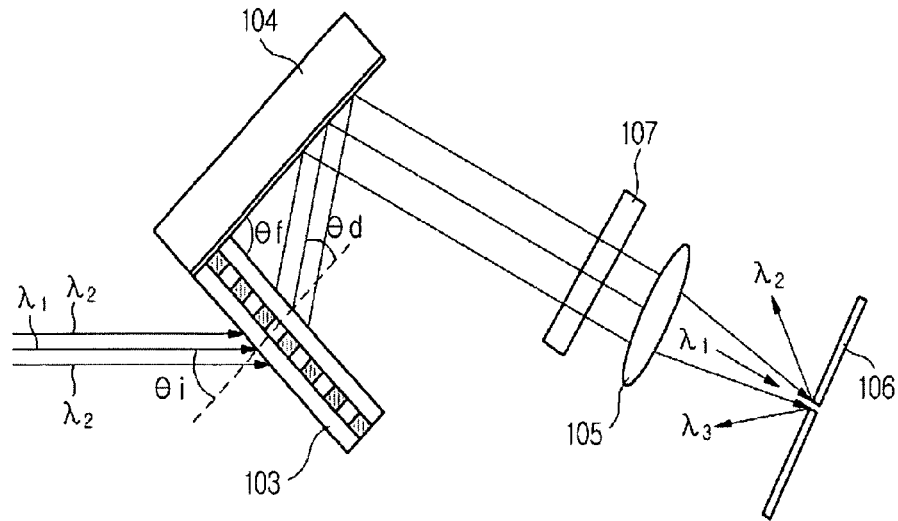
FIG. 7 is a view illustrating a method of setting a light path according to another embodiment of the present invention.
Figure 8:
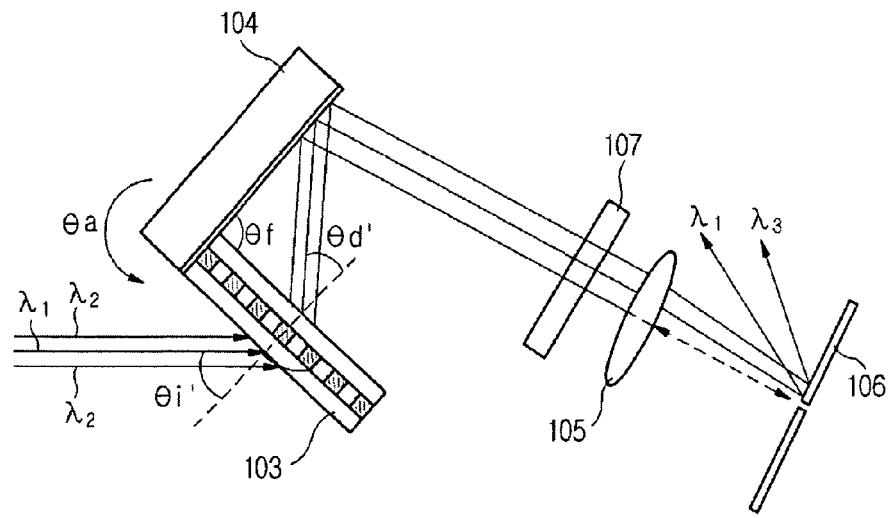
FIG. 8 is a view illustrating a wavelength tuning method used in the wavelength tuning apparatus according to another embodiment of the present invention.

FIGS. 6 to 8 are views for explaining a resonance method and a wavelength tuning method used in a wavelength tuning laser output apparatus according to the embodiment of the present invention described with reference to FIG. 4 in detail. For the convenience of description, only three wavelengths $\lambda_1, \lambda_2, \lambda_3$ among the spectrum profile illustrated in FIG. 5 are described. For example, it is assumed that $\lambda_1, \lambda_2$, and $\lambda_3$ are 635 nm, 636 nm, are 634 nm, respectively, the transmission-type diffraction grating is the VPHG, and the arrangement of the grids is 12001 pmm (line per millimeter, that is 12001 lines per 1 mm). In the drawings, the sizes of the components are exaggerated for clarity.

The resonance method is described with reference to FIG. 6. A total reflection mirror is disposed on the left of the illustrated laser diode 101, and an antireflection coated partial reflection mirror is disposed on the right thereof to remove internal resonant noises. Lights of a plurality of wavelengths output from the laser diode 101 become parallel light through the collimator lens 102 to be incident on the wavelength selection unit including the transmission-type diffraction grating 103 and the mirror 104. The incident light is emitted through the predetermined light path by diffraction and reflection due to transmission and focused on the lens 105 to be converged into the pinhole of the pinhole lens 106. On the light path, a coupler 107 for reflecting a portion of the incident light is disposed to feed the portion of the incident light back to the laser diode 101 to induce resonance. Accordingly, due to the resonance, a gain of a selected wavelength gradually increases and light can be produced at the corresponding wavelength. Here, only light having the selected wavelength $\lambda_1$ with the diffraction angle equal to the angle of incident is output through the pinhole, and light not having the selected wavelength $\lambda_1$, e.g. $\lambda_2$, $\lambda_3$, etc., cannot pass through the pinhole and destroyed.

For the convenience of description, in the illustrated construction, the components are simplified. In addition, an adjusting unit for adjusting a shape of light in a circular shape and a focus thereof, a coupler for accurate resonance, and the like may further be included. However, the basic principle is similar.

FIG. 7 is a view for explaining an arrangement of the transmission-type diffraction grating 103, the mirror 104, and the light path and a method of selecting the angle of incidence.

By using the assumed values described above, the angle $\theta_i$ of incidence which is equal to the diffraction angle $\theta_d$ to obtain optimal efficiency according to wavelengths is calculated. Using Equation 1, the following equation can be derived.

$$635 \text{ nm} = (1 \text{ mm}/1200) \times 2 \times \sin\theta$$

Therefore, the angle of incidence with highest efficiency at the wavelength of 635 nm is calculated as about 22.396° by using $\sin^{-1}(635 \times 6 \times 10^{-4})$.

Specifically, when the wavelength of 635 nm is to be selected, the transmission-type diffraction grating 103 is rotated to allow the angle $\theta_i$ of incident light to be 22.396°, light that is output at the same diffraction angle $\theta_d$ is considered as the highest efficiency diffraction angle, and the mirror 104 and the transmission-type diffraction grating 103 are disposed so that the light is converged on the pinhole of the pinhole lens 106. Accordingly, a fixed angle $\theta_f$ is obtained. Through the aforementioned operations, initial designing and wavelength selection can be performed.

In other words, in the initial designing, the arrangement position of the mirror 104 is selected and fixed so that the incident light having the wavelength having the diffraction angle equal to the angle of incidence can be converted on the output point (pinhole).

FIG. 8 is a view for explaining a method of selecting another wavelength by rotating the transmission-type diffraction grating 103 and the mirror 104 that are fixed as illustrated in FIG. 7. In order to select the wavelength $\lambda_2$ of 636 nm, an angle of incidence is calculated as about 22.433° by using $\sin^{-1}(636\times6\times10^{-4})$. Therefore, when the combined structure including the diffraction grating 103 and the mirror 104 with the fixed angle is rotated on a rotation axis P at an angle of about 0.037° corresponding to a control angle $\theta_a$, the wavelength $\lambda_2$ of 636 nm that is diffracted with highest efficiency when the angle of incidence and the diffraction angle are 22.433° is output through the pinhole. The rotation axis is a point at which a diffraction axis of the diffraction grating and an extended line of a reflection surface of the mirror cross, which is marked as P in the FIG. 8.

In order to select the wavelength $\lambda_3$ of 634 nm, the combined structure is rotated to have the incidence angle of 22.358°.

Specifically, the fixed angle between the diffraction grating 103 and the mirror 104 is set to align the light path for enabling the light having the diffraction angle equal to the angle of incidence to be incident on the output point. In addition, angles of incidence of the diffraction grating 103 and a light source are set to provide light having a wavelength selected according to the corresponding angle of incidence on the light path. Accordingly, the angle of incidence and the diffraction angle of light having the selected wavelength are always equal in this construction. Therefore, highest efficiency can be maintained, and light having a desired wavelength can be selected by a minimum size apparatus and a single angle control operation to provide the light to the output point with highest efficiency.

Figure 9:
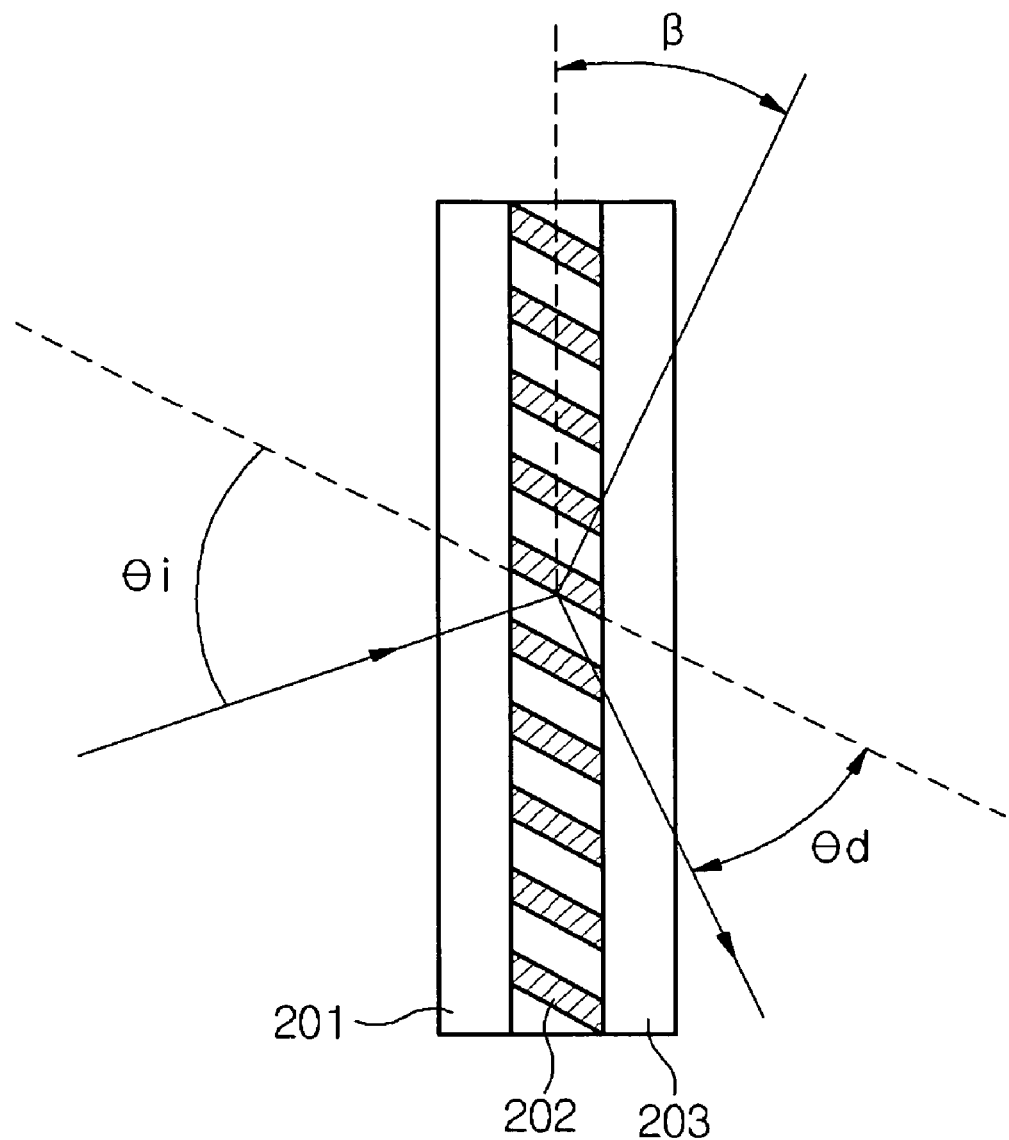
FIG. 9 is a view illustrating a construction of a transmission-type diffraction grating for explaining diffraction characteristics of the transmission-type diffraction grating.

FIG. 9 illustrates another construction of a transmission-type diffraction grating that can tune a light path. FIG. 9 shows diffraction when a grid arrangement angle of the diffraction grating is tilted.

The angle of the arranged mirror combined with the transmission-type diffraction grating in one-body type is controlled to set a light path for converging a diffraction angle of the selected wavelength output with optimal efficiency on the output point. However, a reflection range of the mirror is limited, a shape of light may be changed according to a reflection angle, and a density of different wavelengths may be changed. Therefore, it is difficult to practically select a desired path. In other words, there are needs to design various light paths according to a construction, a size, and a purpose of a laser apparatus so that incident light can be output in the incident direction and a light path can be controlled to output light in a direction perpendicular to the incident light. However, with only the mirror, high-precision wavelength selection is difficult and path selection is limited. To solve the aforementioned problem, a transmission-type diffraction grating capable of controlling the arrangement angle of the grids without an additional optical device (such as a mirror) that has the limited light path selection is used.

As illustrated in FIG. 9, when the grids are tilted by β with respect to the center line (dotted line) in a length direction, an angle $\theta_i$ of incidence and a diffraction angle $\theta_d$ are calculated on the basis of the arrangement angle (tilted dotted line) of the grids. Even in this case, Equation 1 can also be applied as long as the tilted angle of the girds is used as a basis instead of the perpendicular line.

Specifically, when the diffraction angle $\theta_d$ and the angle $\theta_i$ of incidence are equal, the diffraction angle has optimal efficiency, the diffraction angle that is symmetrical to the angle of incidence with respect to the grid arrangement angle is used to determine the arrangement angle of the mirror to set the light path, and the angle of incidence for wavelength selection is selected by using the existing equation.

Figure 10:
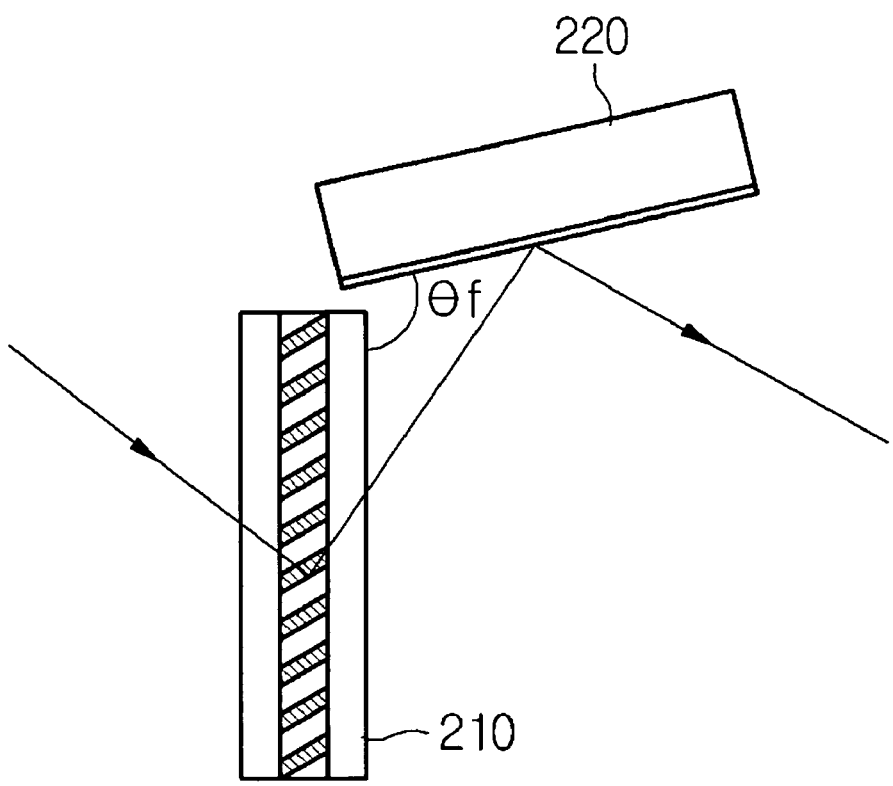
FIGS. 10 and 11 are views illustrating examples of the method of setting a light path.
Figure 11:
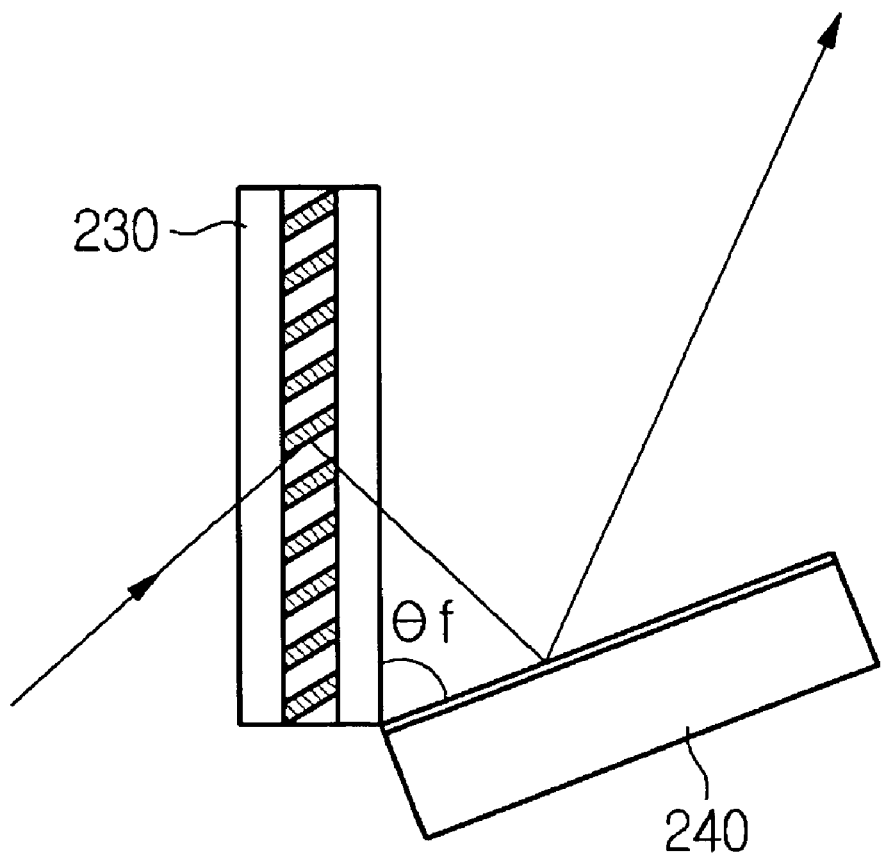
Figure 12:
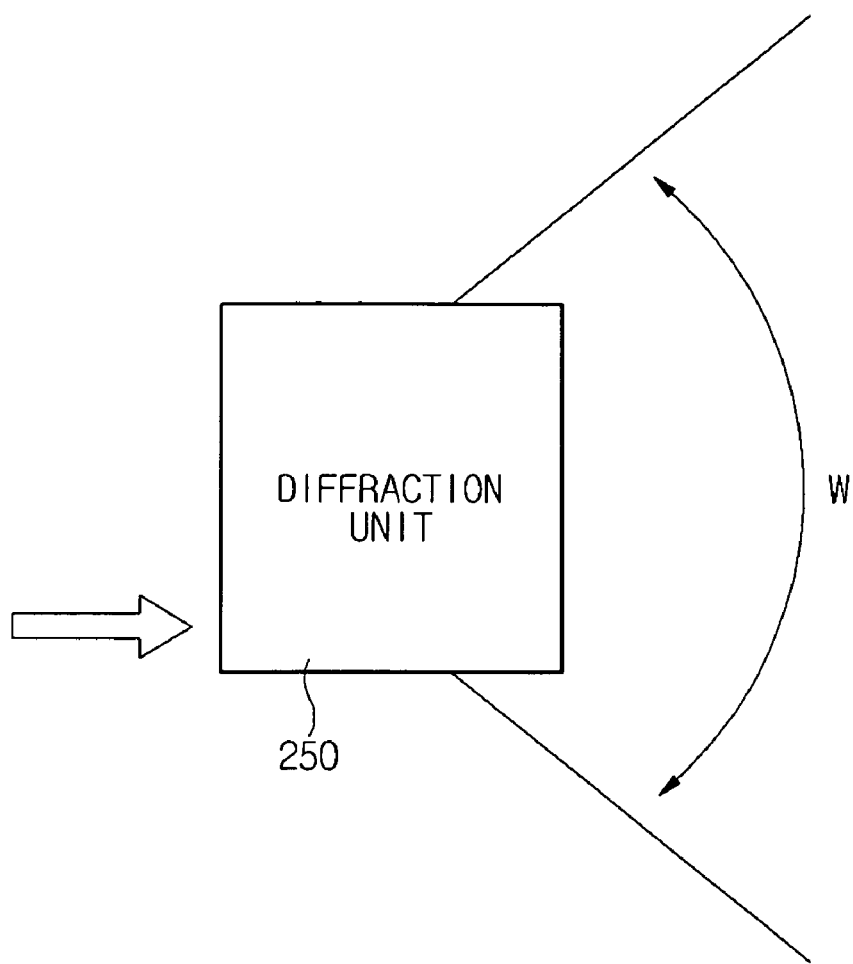
FIG. 12 is a conceptual view illustrating a light path setting range according to another embodiment of the present invention.

FIGS. 10 and 11 illustrate methods of setting a light path using a transmission-type diffraction grating and a mirror. In a construction illustrated in FIG. 10, an angle between a transmission-type diffraction grating 210 and a mirror 220 is set to an obtuse angle, and in a construction illustrated in FIG. 11, an angle between a transmission-type diffraction grating 230 and a mirror 240 is set to an acute angle. Specifically, as illustrated in FIG. 12, by using a single unit (referred to as a diffraction unit 250) which is formed by combining a diffraction grating with a mirror by controlling a grid arrangement of the diffraction grating and an angle of the mirror, optimal efficiency and wavelength selection precision can be maintained, and a light path can be freely designed in a wide range w. Therefore, the wavelength tuning apparatus can be constructed to have a desired shape and size, and light sources and outputs can be properly arranged.

Figure 13:
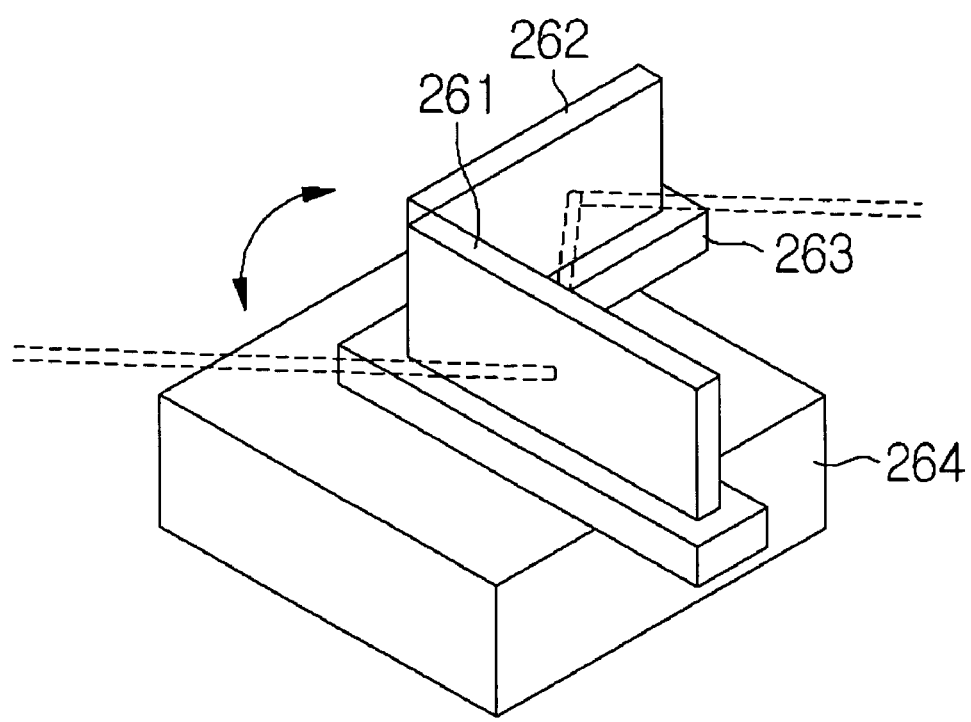
FIGS. 13 and 14 are perspective views illustrating constructions of an optical cavity according to another embodiment of the present invention.
Figure 14:
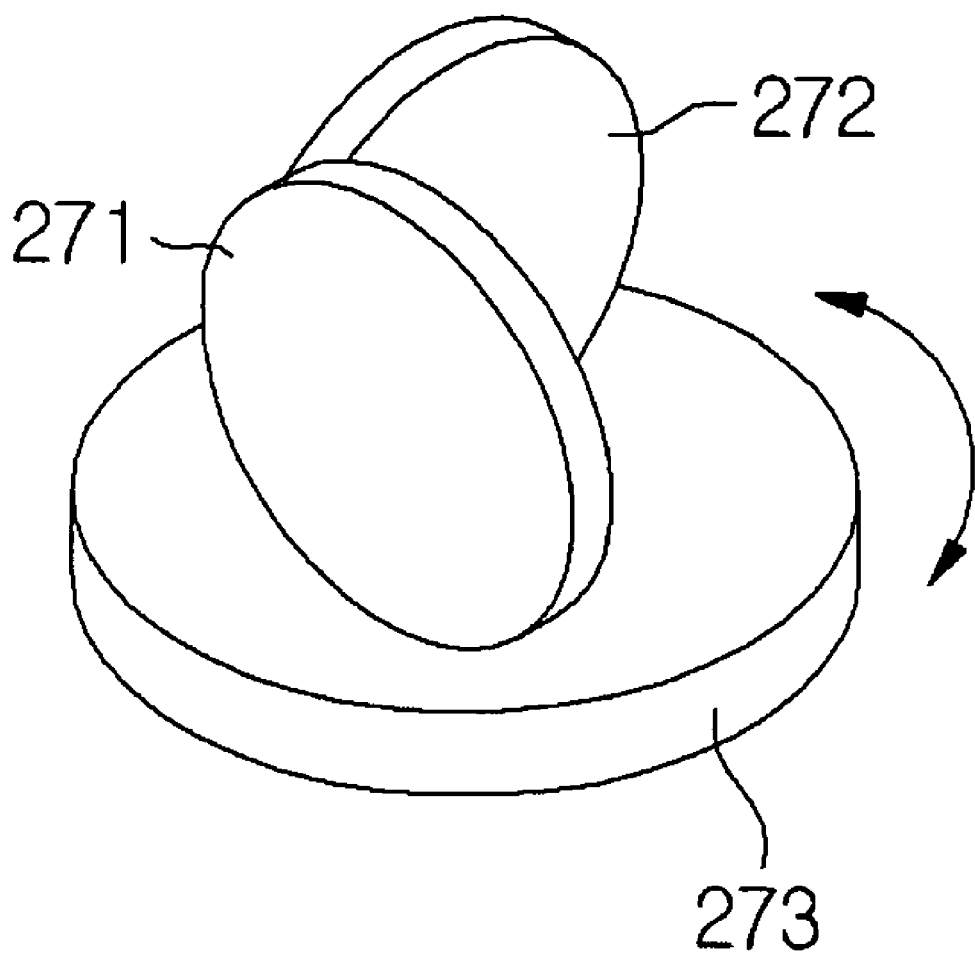

FIGS. 13 and 14 are views illustrating examples of a practical arrangement and construction of a transmission-type diffraction grating and a mirror. Referring to FIG. 13, a transmission-type diffraction grating 261 and a mirror 262 are fixed to a one-body combining unit 263, and the combining unit 263 is rotated by a rotation unit 264. A rotation axis of the combining unit 263 is a point (a contact point in the illustrated construction) at which a diffraction axis of the transmission-type diffraction grating 261 and an extended line of a reflection surface of the mirror 262 cross, and the rotation unit 264 has to be constructed to perform precise rotation. According to circumstances, a position of the rotation axis may be changed (for example to a point of incidence of the diffraction plate, etc.). Referring to FIG. 14, a transmission-type diffraction grating 271 and a mirror 282 having circular shapes but not shapes of plates are fixed to a combining unit 273 having a circular shape. Since a region on which a light source is incident and a region for determining a light path are not large, sizes of the transmission-type diffraction grating 271, the mirror 272, and the combining unit 273 can be reduced.

Figure 15:
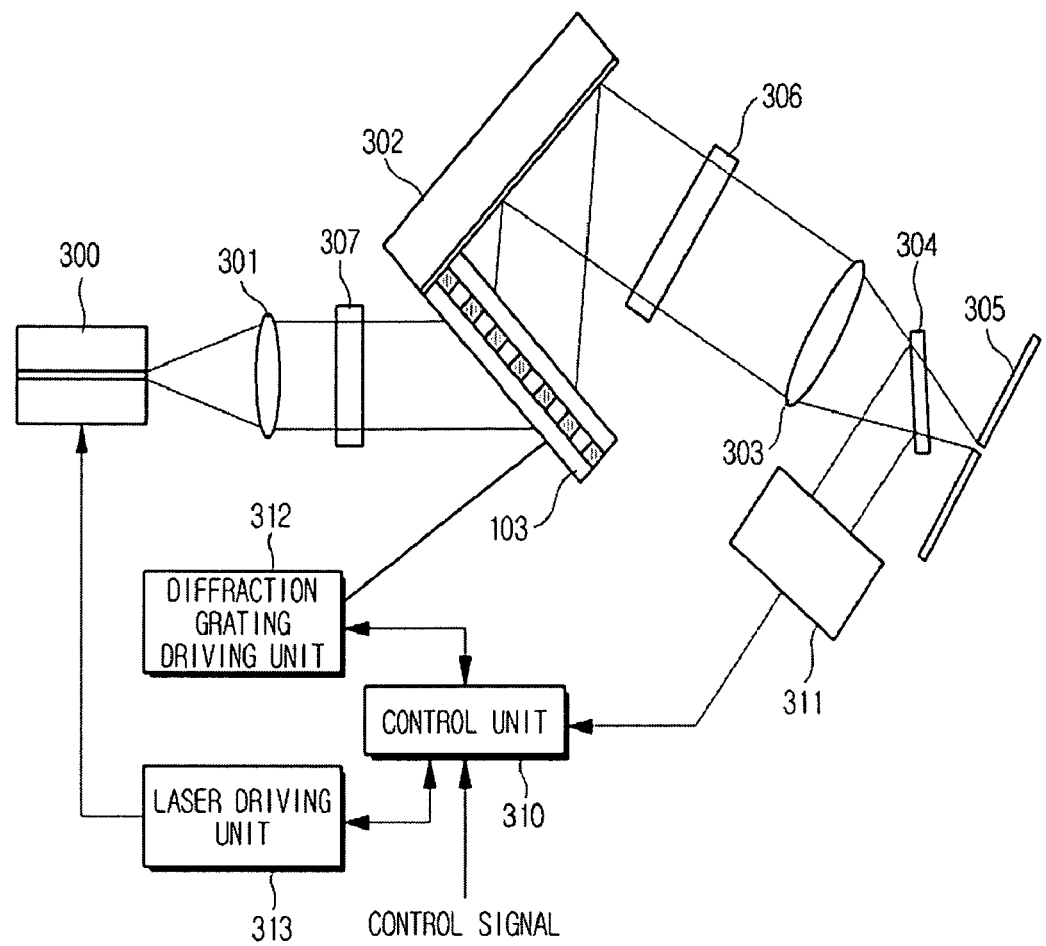
FIG. 15 is a view illustrating a construction of a wavelength tuning apparatus according to another embodiment of the present invention.

FIG. 15 illustrates an example of the aforementioned construction to show practical control operations. Referring to FIG. 15, a correcting unit 307 which includes one or more of a shape correcting unit for correcting a shape of a parallel light and a focus correcting unit for correcting a focus is provided after a laser diode 300 and a collimator lens 301. Light passing through the correcting unit 307 passes through a diffraction unit 302 including a transmission-type diffraction grating and a mirror, a portion of the light is reflected while passing through a coupler 306 to resonate a selected wavelength, and the light passing though the coupler 306 is converged on a lens 303 through a pinhole of a pinhole lens 305. Here, a partial reflection mirror 304 for reflecting a portion of the light passing through the lens 303 to the outside of the light path and a monitor unit 311 for converting an output of the partially reflected light into an electrical signal may further be included. In addition, a diffraction grating driving unit 312 for rotating the diffraction unit 302, a laser driving unit 313 for driving the laser diode 300, and a control unit 310 for controlling the diffraction grating driving unit 312 to have an angle according to an external control signal and controlling a magnitude of current provided from the laser driving unit 313 by comparing an output of the monitor unit 304 and an output magnitude according to the external control signal may further be included.

Through the aforementioned construction, a desired wavelength may be selected and output to have a desired output magnitude according to the external control signal. Of course, for more precise control, additional units may further be included, and a unit for maintaining a temperature may be included.

Figure 16:
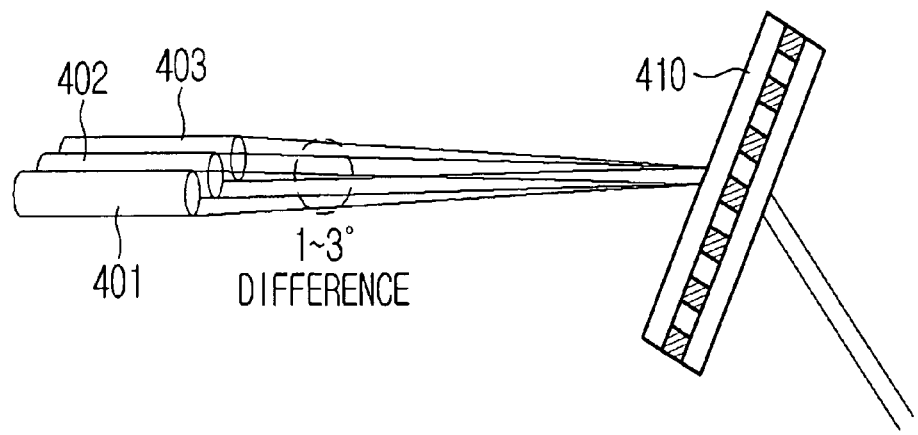
FIGS. 16 and 17 are views illustrating examples of a method of arranging a plurality of light sources.
Figure 17:
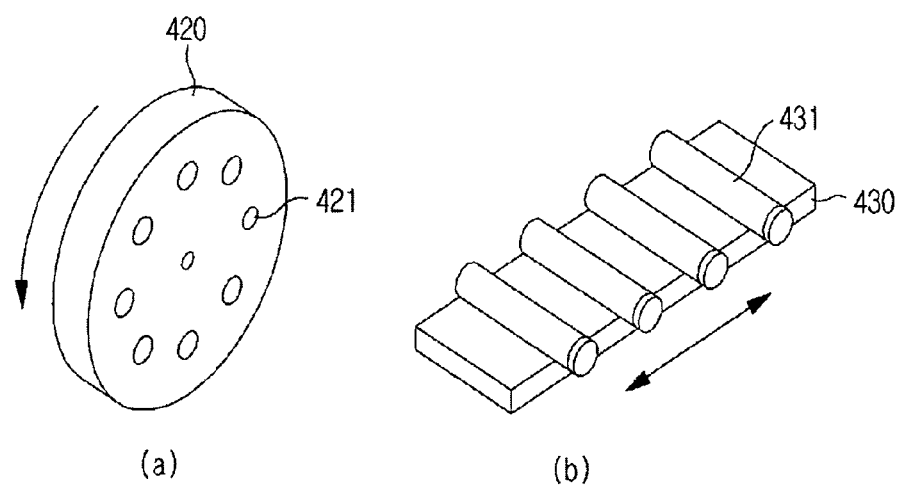

FIGS. 16 and 17 illustrate constructions for electrically or mechanically selecting one from a plurality of laser lights to widen a range of wavelengths that are to be selected. FIG. 16 illustrates a construction in which a plurality of laser lights 401, 402, and 403 are disposed closely so that the laser lights are incident on the same point of a transmission-type diffraction grating 410, and only a light source that can provide a needed wavelength is selected and driven. This is referred to as a spectral combining method.

FIG. 17 illustrates a construction in which a plurality of laser light sources are mechanically sequentially arranged according to wavelength bands, and a laser light source that can provide a desired wavelength is disposed at a light source providing position. FIG. 17a illustrates light sources 421 that are arranged in a revolver type 420. FIG. 17b illustrates light sources 431 that are arranged in a linear type 430.

The aforementioned mechanical constructions may be controlled according to the selected wavelength by the controller illustrated in FIG. 15 so that a needed laser light source can be automatically selected and disposed.

Figure 18:
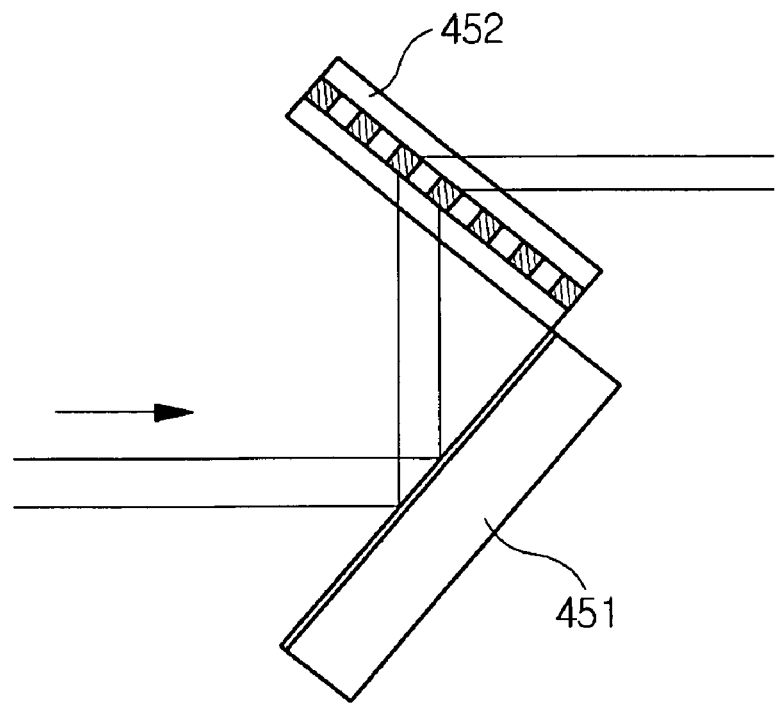
FIG. 18 is a view illustrating an example of a disposing an optical cavity.

FIG. 18 illustrates a case where a transmission-type diffraction grating 452 and a mirror 451 are arranged in reverse order of the light path. As illustrated in FIG. 18, through this arrangement, the same effects as the aforementioned forward direction arrangement can be obtained, so that the order of arrangement can be freely changed.

Figure 19:
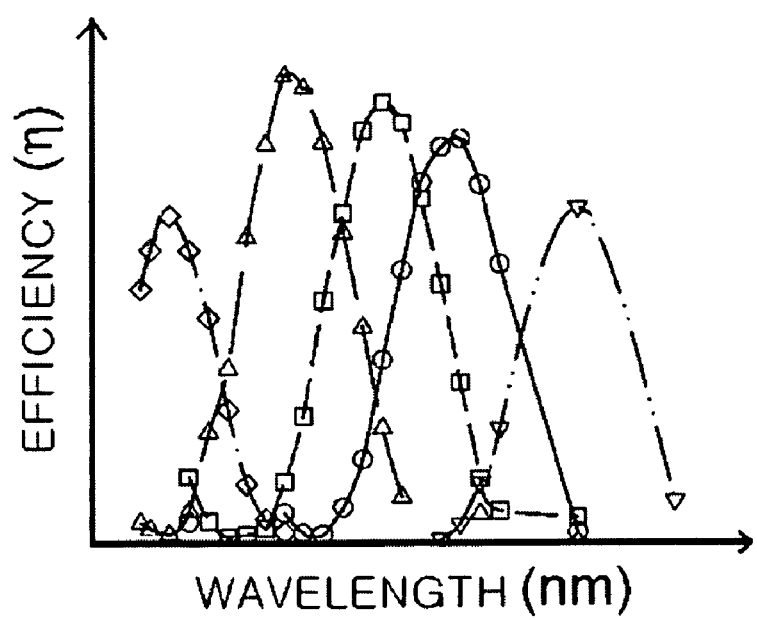
FIG. 19 is a graph illustrating general diffraction efficiencies according to wavelengths.

FIG. 19 illustrates efficiencies according to wavelengths measured when a transmission-type diffraction grating is used. The efficiencies are measured by tuning wavelengths but fixing an angle of incidence. Therefore, each parabola means values of the efficiencies measured according to wavelengths at a single fixed angle of incidence. As illustrated in FIG. 19, when the angle of incidence of the transmission-type diffraction grating does not correspond to a wavelength, the efficiency thereof is sharply decreased. Therefore, when the transmission-type diffraction grating is used, there are needs to control an angle of incidence according to wavelengths and control setting of a light path for a diffraction angle that is changed according to the angle of incidence. In other words, two controlling steps are needed to effectively tune the wavelength.

Figure 20:
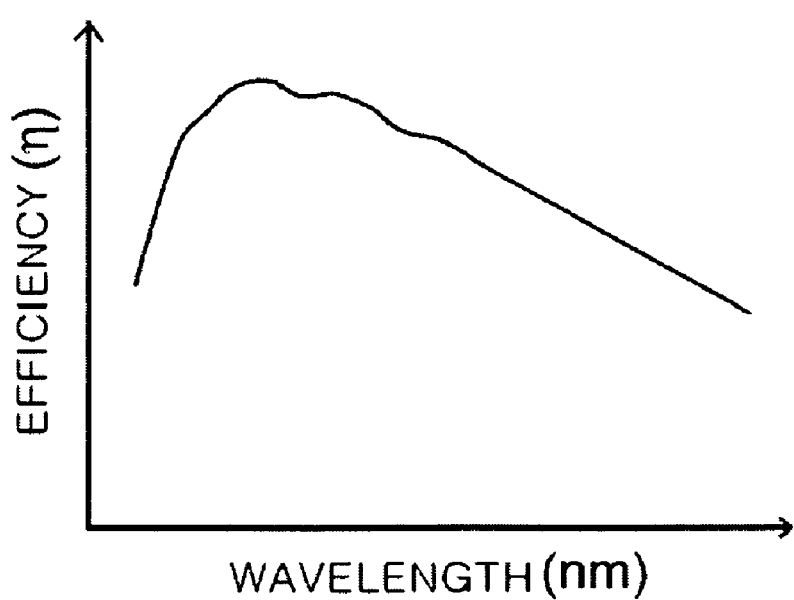
FIG. 20 is a graph illustrating diffraction efficiencies according to wavelengths according to another embodiment of the present invention.

FIG. 20 illustrates an efficiency of an optical cavity according to another embodiment of the present invention. As illustrated in FIG. 20, in designing, a light path is formed at a diffraction angle with highest efficiency, and for a selected wavelength, a corresponding optimal environment is automatically provided and operated, so that with a single control step, highest efficiency can be obtained at any wavelength.

The wavelength tuning apparatus and method according to the embodiments of the present invention includes the diffraction grating and the mirror which are constructed in one-body type so that a light path that enables an optimal efficient reflection angle of the transmission-type diffraction grating can be formed and rotates the one-body construction to obtain a desired wavelength, so that efficiency and precision of manipulation and control can be increased, and costs are reduced.

The wavelength tuning apparatus and method according to the embodiments of the present invention can design a desired light path by selecting a diffraction grid arrangement angle of the transmission-type diffraction grating in a state where highest efficiency is maintained, so that the degree of design freedom of the wavelength tuning apparatus can be increased, and a size of the apparatus can be reduced.

The wavelength tuning apparatus and method according to the embodiments of the present invention is automatically set so that efficiency for a wavelength selected from a wide wavelength band is highest efficiency of the corresponding wavelength by performing a simple angle adjusting operation using a simple operation according to wavelengths. Therefore, the highest efficiency can be maintained without additional correction or manipulation.

The wavelength tuning apparatus and method according to the embodiments of the present invention combines the VPHG and the mirror at the fixed angle so that a diffraction angle of transmitted light in consideration of an angle of incidence of light incident on the VPHG having high transmission efficiency for a wide wavelength band and an arrangement angle of diffraction grids is the highest efficiency angle and the light is converged into a pinhole, so that a size of the apparatus can be reduced and efficiency and wavelength selection precision can be increased with a single operation unit.

The wavelength tuning apparatus and method according to the embodiments of the present invention maintains optimal efficiency according to the selected wavelength to enable effective outputs for most of wavelength bands provided from the laser diode and mechanically or electrically selects one from a plurality of the laser diodes having different wavelength bands. Therefore, the number of wavelengths that can be selected without replacing a light source is increased and a time for selection is reduced. In addition, precise wavelength selection for a wide band can be performed although the number of laser diodes is reduced to reduce costs and sizes.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A wavelength tuning apparatus, comprising:
a light source unit having a predetermined wavelength band;
a transmission-type diffraction unit diffracting a light provided from the light source unit at an angle according to a grid arrangement angle;
a mirror which is disposed to be adjacent to the transmission-type diffraction unit so that a light that passes at a highest efficiency diffraction angle obtained by using an angle of light incident on the transmission-type diffraction unit and the grid arrangement angle passes through a target light path;
a combining unit combining the transmission-type diffraction unit with the mirror as a single structure; and
a driving unit rotating the combining unit according to a selected wavelength, wherein the light source unit includes a plurality of light sources having different wavelength bands and a light source selecting unit for mechanically selecting one from among the light sources, and the light source selecting unit includes an arrangement unit in which a plurality of the light sources are sequentially arranged and a driving unit which mechanically operates the arrangement unit so as to align a desired light source with a position for providing a light to the transmission-type diffraction unit.

2. The apparatus of claim 1, wherein the highest efficiency diffraction angle is a diffraction angle that is equal to an angle of incident light on the transmission-type diffraction unit with respect to the grid arrangement angle.

3. The apparatus of claim 1, wherein the light source unit includes a laser diode and a collimator lens.

4. The apparatus of claim 1, wherein the light source unit is a laser pointer and further comprises a coupler which reflects a portion of the light reflected from the mirror to set an external cavity.

5. The apparatus of claim 4, wherein the light source unit includes a laser diode including an antireflection coated partial reflection mirror and an antireflection coated collimator lens.

6. The apparatus of claim 1, further comprising:
a lens for converging the light reflected from the mirror; and
a pinhole lens through which only one wavelength of the light converged on the lens transmits.

7. The apparatus of claim 1, further comprising a partial reflection and monitor unit for reflecting a portion of the light reflected from the mirror and converting a magnitude of the output into an electrical signal.

8. The apparatus of claim 1, wherein the driving unit rotates the transmission-type diffraction unit and the mirror on a point at which a diffraction axis of the transmission-type diffraction unit and an extended line of a reflection surface of the mirror cross.

9. The apparatus of claim 1, further comprising one or more of a shape correcting unit for correcting the light provided from the light source to have a circular shape and a focus correcting unit for correcting a focus.

10. The apparatus of claim 1, wherein the transmission-type diffraction unit is a volume phase holographic grating (VPHG).

11. A wavelength tuning method, comprising the steps of:
arranging a laser light source unit outputting a plurality of wavelengths according to a determined light path;
arranging a transmission-type diffraction unit which transmits and diffracts light provided from the laser light source unit according to a grid arrangement angle, and arranging a mirror which determines a light path so as to enable light output at a diffraction angle which is symmetric to an angle of incidence of light incident on the transmission-type hologram diffraction grating with respect to the grid arrangement angle to be converged on an output point;
obtaining an angle of incidence of light incident on the transmission-type diffraction unit in consideration of a distance between the grids by selecting a desired wavelength;
rotating the transmission-type diffraction unit and the mirror which are integrated as one so as to have the angle of incident; and
resonating a selected wavelength from the plurality of wavelengths output from the laser light source and outputting the resonated wavelength to the output point,
wherein the step of arranging the laser light source unit further comprises a step of arranging a plurality of laser light sources outputting different wavelength bands so that one is mechanically selected and replaced from the laser light sources and selecting and arranging a laser light source outputting a wavelength band including the corresponding wavelength.

12. The method of claim 11, wherein the transmission-type diffraction unit is a VPHG.

13. The method of claim 11, wherein the step of rotating is performed on a point at which a diffraction axis of the transmission-type diffraction unit and an extended line of a reflection surface of the mirror cross.

14. The method of claim 11, wherein in the step of arranging the transmission-type diffraction unit and the mirror, the transmission-type diffraction unit and the mirror are arranged in reverse order of the light path.

15. The method of claim 11, wherein the step of obtaining the angle of incidence of light incident on the transmission-type diffraction unit is performed by using $\theta=\sin^{-1}(\lambda/2d)$, where $\theta$ is the angle of incidence of the diffraction unit, $\lambda$ is the desired selected wavelength, and d is the distance between the grids.

16. The method of claim 11, wherein in the step of resonating further comprises a step of controlling current of the laser light source unit by measuring a magnitude of the output wavelength such that the output wavelength has a predetermined magnitude.

* * * * *